United States Patent [19]

Hendricks et al.

[11] Patent Number: 6,076,179
[45] Date of Patent: Jun. 13, 2000

[54] METHOD AND APPARATUS OF INCREASING THE VECTOR RATE OF A DIGITAL TEST SYSTEM

[75] Inventors: Matthew C. Hendricks, Palo Alto; Richard Swan, Portola Valley, both of Calif.

[73] Assignee: Altera Corporation, San Jose, Calif.

[21] Appl. No.: 08/790,693

[22] Filed: Jan. 29, 1997

Related U.S. Application Data

[60] Provisional application No. 60/015,667, Apr. 19, 1996.

[51] Int. Cl.$^7$ .............................. G01R 31/28; G06F 11/00
[52] U.S. Cl. ............................................. 714/742
[58] Field of Search .................. 364/468.28; 371/22.36, 371/22.3, 22.4, 21.6, 27.1; 714/718, 742

[56] References Cited

U.S. PATENT DOCUMENTS

| | | | |
|---|---|---|---|
| 4,379,259 | 4/1983 | Varadi et al. | 395/183.21 |
| 4,929,889 | 5/1990 | Seiler et al. | 371/22.36 |
| 5,432,797 | 7/1995 | Takano | 714/738 |
| 5,497,079 | 3/1996 | Yamada et al. | 324/158.1 |
| 5,608,337 | 3/1997 | Hendricks et al. | 324/765 |
| 5,682,472 | 10/1997 | Brehm et al. | 395/183.01 |
| 5,723,375 | 3/1998 | Ma et al. | 438/258 |

*Primary Examiner*—Albert De Cady
*Assistant Examiner*—Shelly A. Chase
*Attorney, Agent, or Firm*—Charles J. Kulas; Townsend and Townsend and Crew, LLP

[57] ABSTRACT

The present invention provides a method and apparatus for increasing the vector rate of an integrated circuit test system and simplifying the wiring of the tester to the device under test. The tester incorporates circuitry that allows the CPU to remap assignments of tester channels in the CPU address space during testing.

6 Claims, 12 Drawing Sheets

METHOD AND APPARATUS OF INCREASING THE VECTOR RATE OF A DIGITAL TEST SYSTEM

CROSS-REFERENCE TO RELATED APPLICATION

This application claims priority from Provisional Application Ser. No. 60/015,667, filed Apr. 19, 1996, which Provisional Application is hereby incorporated by reference.

BACKGROUND OF THE INVENTION

The present invention relates generally to the manufacturing and testing of integrated circuit chips. Specifically, a method and apparatus are provided for increasing the vector rate of a digital test system used in testing an integrated circuit chip.

Integrated circuit chips customarily undergo exhaustive testing during the manufacture process prior to encapsulation in a package or use of the package on a circuit board in order to ensure reliable operation of the chip. The chip die undergoes functional and parametric testing in at least two different stages of the manufacturing process. At one stage, a semiconductor wafer containing multiple chip dice is probed by a probe tester that tests each of the dice individually. At another stage, after an individual chip die has been encapsulated in a package, a programmable package tester can be used to thoroughly test the integrated circuit chip package.

In a preferred digital test system, testing is controlled by a control unit, which may be, for example, a central processing unit (CPU) or a dedicated block of control logic. Testing of the chip itself is performed by vector execution, where instructions from the control unit address tester cards via a test bus. These test systems generally include memory space for storing state information for each pin of the integrated circuit chip. The memory space is typically divided into separate channels. In order to perform a functional test of the device, the device tester, under control of appropriate test software, applies excitations to and receives responses from the device under test (DUT) under control of the tester. Each resultant output state of the DUT is compared to an expected value by the tester. If the actual and expected values correspond, the chip has passed the test. For example, the integrated circuit chip may be a programmable logic device (PLD), which is a programmable integrated circuit that allows the user of the circuit, using software control, to customize the logic functions the circuit will perform. In this example, a first group of test vectors is used to initialize the PLD in a desired logic configuration, and a second group of test vectors is then used to exercise the configured PLD. Again, the observed result is then compared with an expected result to see if the PLD is functioning properly.

In such test systems, the speed with which the control unit can access DUT cards is of primary importance. The faster the control unit can execute the access instructions, the greater the resultant test vector rate. A control unit can perform separate bus access operations only up to a certain size. For example, for a 32-bit wide bus, the reading or writing of more than 32 channels of test data to the DUT entails multiple instructions and multiple bus cycles, one for each group of 32 channels. The greater the number of channel groups, the slower the vector rate, since additional bus cycles will be necessary for each read or write operation.

A drawback of current tester systems is that the memory space is unchangeable. As an example, assume that each tester channel has a natural index, such that tester channel 0 has an index of 0, tester channel 32 has an index of 32, and so forth. For the purposes of accessing each channel, given the above example of a 32-bit wide system bus, channel groups are broken down into 32 bit packets. Thus, a possible way to refer to the address of index 0 (channel 0) would be bit position 0 in word 0, while the address of index 1 (channel 1) would be bit position 1 in word 0. Similarly, index 32 (channel 32) is accessed at bit position 0 in word 1, index 33 (channel 33) at position 1 in word 1, and so on. Thus, each index has a unique address by which is it accessed for read and write operations to the DUT.

The fixed memory space forces very careful selection of the connections between the integrated circuit chip pins and the tester channels, such that the most frequently used channels are grouped together. However, this practice is quite inefficient as it is nearly impossible to group channels so that the pin-channel assignments for all or even most possible chip configurations are optimized. A grouping that works well for a particular sequence of test vectors may not be as desirable for another sequence. Thus, since the required tester channels are often spread across two or more channel groups, additional, unnecessary bus cycles are required. This phenomenon occurs quite frequently in testing integrated circuit chips since test programs often actively change the states of only a subset of the DUT pins while the states of the remaining pins are constant. So, the testing process may require several bus cycles to write each vector to the DUT. As device sizes grow, and the width of vectors and required bus cycles increase correspondingly, the testing process will take more and more time.

An additional drawback to the above testing configuration is that the connection of the tester channels to the pins on the DUT can be very unwieldy. The configuration that may be optimal for some tests may entail running long wires or traces on a printed circuit board from one side of the DUT card to the other to couple the appropriate DUT pins to the corresponding tester channels.

Therefore, a new testing method and apparatus are desired to increase the vector rate to speed up the testing process and to reduce the wiring overhead.

SUMMARY OF THE INVENTION

The present invention provides a method and apparatus for increasing the vector rate of an integrated circuit test system and simplifying the connection of the tester to the device under test. The tester incorporates circuitry that allows a test control unit to remap the index of a tester channel in the memory space of the tester. Since the index of a tester channel is not tied to a particular location in the memory space, a channel index may therefore be assigned to one channel group for one sequence of test vectors, then remapped so that it is assigned to another channel group for another sequence of test vectors. Remapping of the memory space allows the frequently used channels for a given test to be organized into the fewest possible channel groups, minimizing the required number of bus accesses, and consequently improving the test vector rate. In a preferred embodiment, four subblocks of eight channels each may be mapped into a 32-bit wide channel group. Memory space remapping also allows an optimal DUT card layout by permitting the wiring of the tester channels to the pins on the DUT to be done in the most convenient and efficient way, since tester channels can be grouped together for efficient access regardless of their physical proximity.

A further understanding of the nature and advantages of the inventions herein may be realized by reference to the remaining portions of the specification and the attached drawings.

DESCRIPTION OF THE PREFERRED EMBODIMENT

Figure 1A:
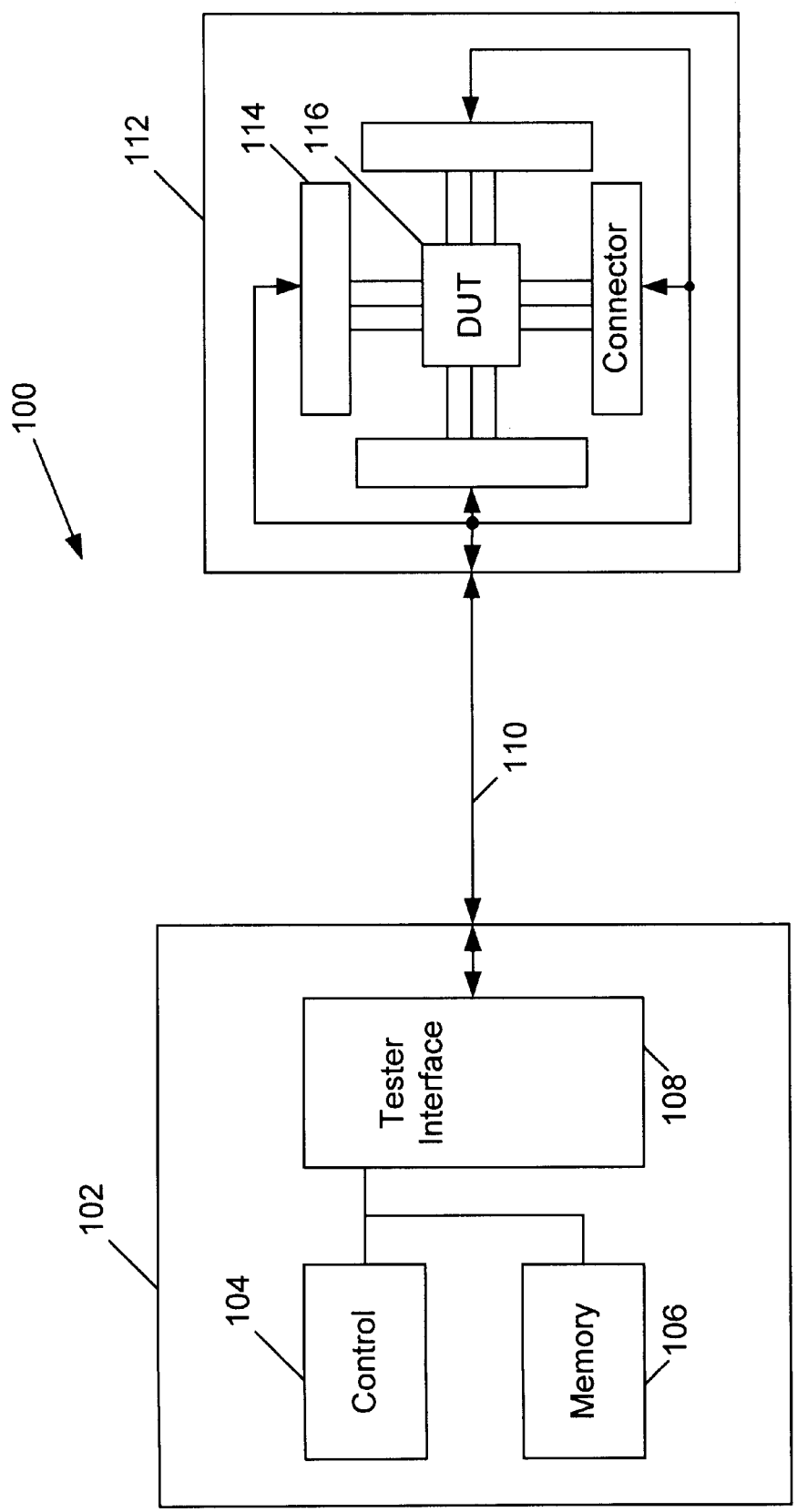
FIGS. 1A and 1B show block diagrams of a digital test system for an integrated circuit chip.

FIG. 1A shows a simplified block diagram of a general digital test system 100 for an integrated circuit chip. Tester 102 includes a control block 104, a memory block 106 and a tester interface block 108. Control block 104 executes the instructions to control the testing process and memory block 106 contains the vector information for the testing cycles. In a preferred embodiment, tester interface block 108 includes the circuitry required to carry out testing on an integrated circuit chip by driving the vector information to the device under test. Tester 102 is coupled via bus 110 to test card 112. Test card 112 includes connectors 114 and device under test (DUT) 116. Connectors 114 are coupled to bus 110 and transfer test data between bus 110 and DUT 116 across hardwired connections to DUT 116.

A general purpose computer system is a preferred part of any modern test system. The main memory of a computer is a very cost-effective and convenient storage mechanism for test vector information. The vectors can be generated directly from a program and can be stored conveniently on disk. Complex vector sequences and vector sequences generated interactively can be executed under program control by the CPU. In an alternate embodiment, program control could be executed by a dedicated block of control logic. For higher speed test sequences, the vector information can be accessed via direct memory access (DMA) mechanisms built into the computer system. An effective unit for accessing and communicating test vector information is one computer word, which may be, for example, 16, 32 or 64 bits wide, depending on the test system in use. Reducing the bandwidth utilized to execute a test sequence requires an effective system for representing test vectors in the vector storage means and an effective method of decoding the information and distributing it to each pin at the DUT interface.

Figure 1B:
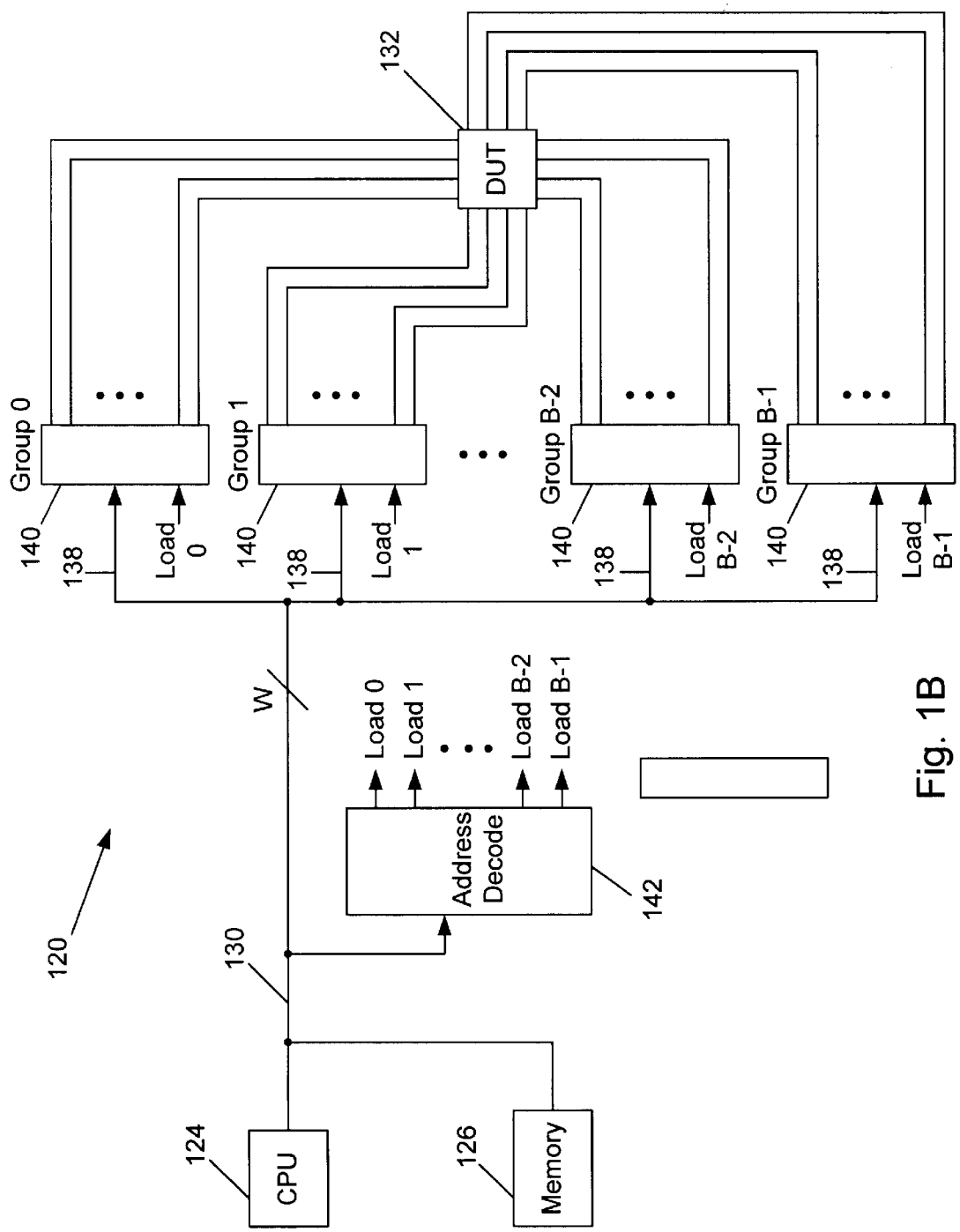

Therefore, FIG. 1B shows a conceptual diagram of a preferred embodiment of a digital test system 120 in further detail where the tester is implemented by a general purpose computer system. Test system 120 includes a central processing unit (CPU) 124, a memory space 126 and tester interface block coupled via internal bus 130. CPU 124 executes the instructions to control the testing process and memory space 126 contains the vector information for the testing cycles. This information is loaded into DUT 132. There are a total of P tester channels 138 that are arranged in B blocks 140, where each block supports W channels. W is the word size of the computer, which may be, for example, 32 bits, transferred on internal bus 130. Since each tester channel may be coupled to a DUT pin, there are also up to P DUT pins. (The number of tester channels may exceed the number of DUT pins.) Each block 140 of channels is loaded by decoding the address from the computer b1 address decode block 142. Changing the state of all tester channels would require B transactions, one to load each of the B blocks and transfer the data to DUT 132. Note that FIG. 1B is a conceptual diagram showing the correspondence of tester channels to DUT pins; the actual circuitry more closely follows the system diagram shown in FIG. 1A.

As noted above, in practical test sequences for high pin count devices, not all pins are required to change on each test cycle. FIG. 2A shows a simplified diagram of a portion of the pins 202 of a sample DUT 116 arranged vertically from pin 0 to pin, with divisions for each channel group 204 of 32 pins, using an example where the computer word size is 32 bits. A test engineer, or certain automatic software, may determine that certain pins change frequently while the remainder change less frequently. These pins are marked as active pins 206 in the diagram. It takes one cycle from the computer to update each 32-bit channel group 204 across a 32-bit bus, such as the one shown in FIG. 1A. Thus, in this example, where the active pins are scattered over all but one of the six channel groups 204 shown in the figure, five bus accesses to the DUT are required, since each tester channel is fixed in the memory space of the tester, as described above. Again, although the pins which must change frequently can be grouped within a single channel group or a small number of groups in an attempt to minimize the number of bus cycles, the pins which must change during the test vary between device types and from test to test while testing any particular type of device.

Figure 2B:
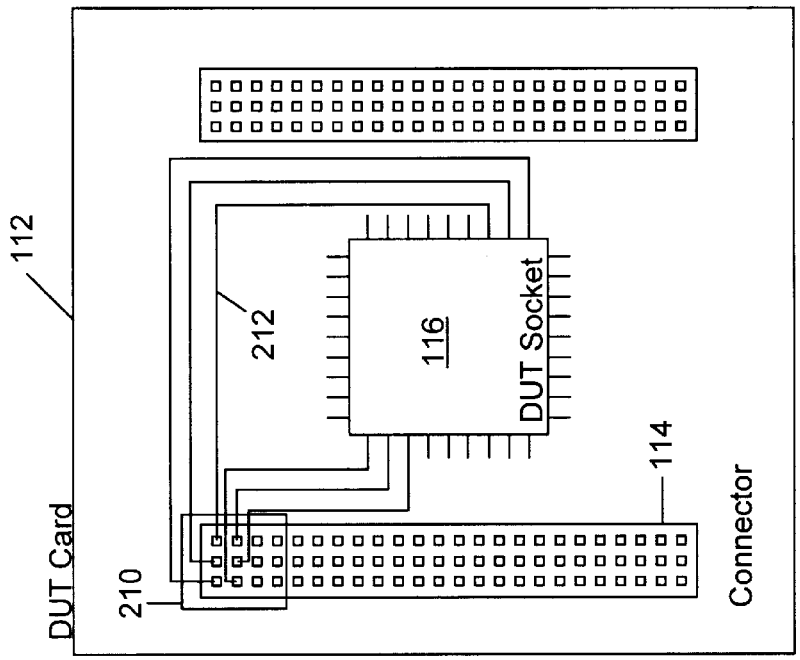
FIG. 2B shows a prior art DUT card.
Figure 2A:
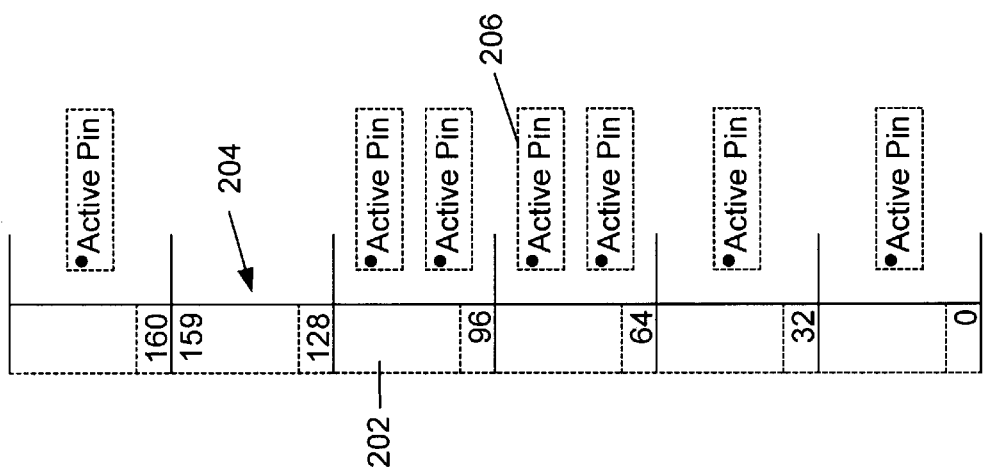
FIG. 2A shows a simplified diagram of a portion of the pins of a sample device under test arranged in a vertical fashion.

FIG. 2B shows the physical effects of the drawbacks to prior art testers. A simplified version of DUT card 112 is shown with pin group 210 from connector 114 hardwired to DUT 116 by wires or printed circuit traces 212. The grouping of connector pins shown in the figure is a simplified representation of one channel group, such as, for example, channel group 204 from FIG. 2A. Again, because this group of pins on DUT 116 may be frequently accessed by a routinely performed testing operation, it is efficient for a prior art tester to group the corresponding channels into one channel group. This entails a connection from bus 110 to the group of connector pins 210. But this also requires that traces 212 be run from one side of DUT card 112 to the other, which can be very unwieldy, especially when the scenario is repeated for each succeeding channel group.

Figure 2C:
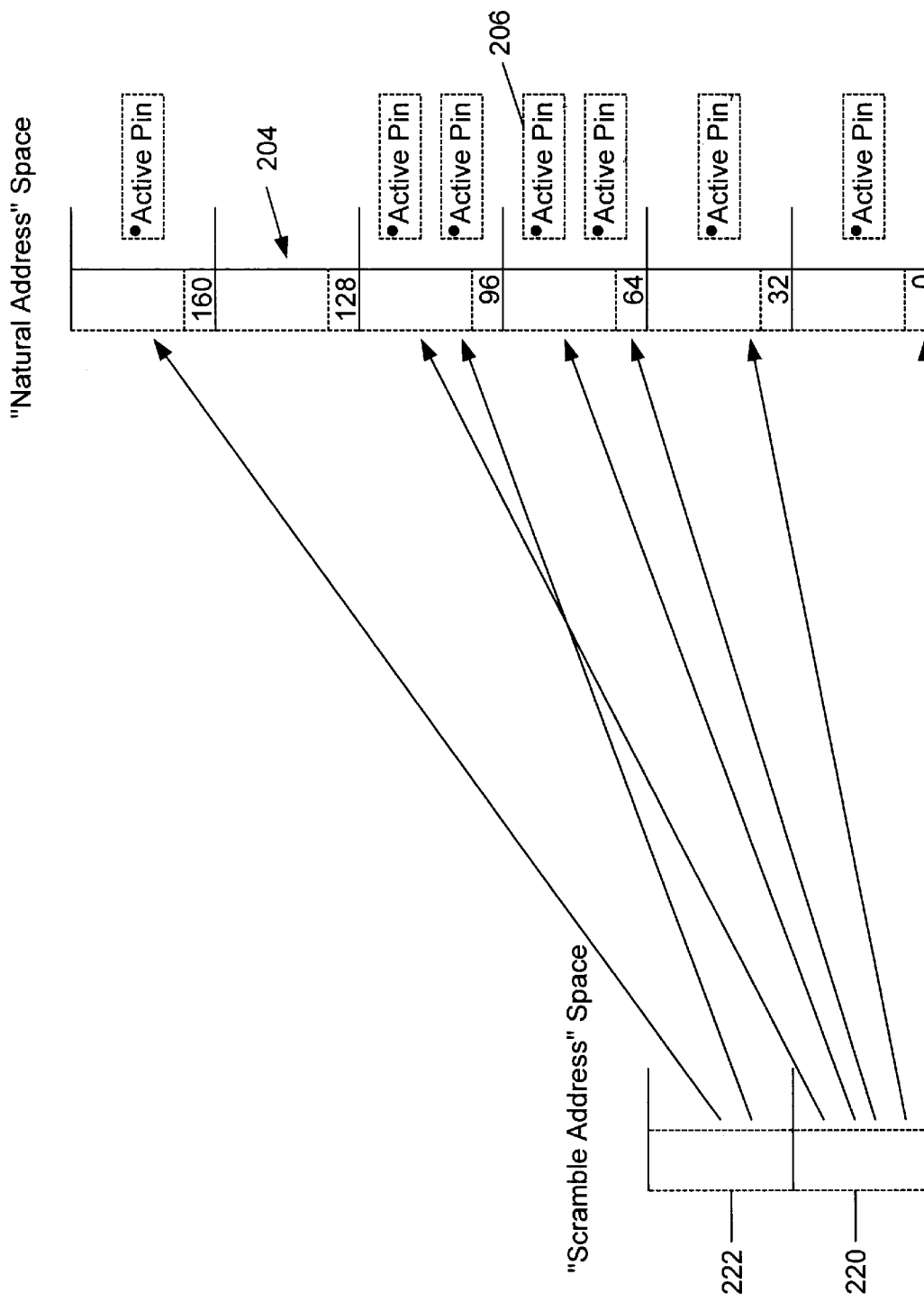
FIG. 2C shows a simplified diagram of a portion of the pins of a sample device under test mapped into a minimum number of channel groups.

In the present invention, tester interface block 108 of FIG. 1A includes circuitry to remap channel index assignments so that a minimum number of bus cycles is required to read data from or write data to DUT 116 and the wiring overhead is reduced. Therefore, from the preceding example, rather than requiring five bus cycles to write data to DUT 116 from active tester channels spread across four channel groups, FIG. 2C shows how those active channels may be mapped into the minimum number of channel groups, which allows those channels to be written to DUT 116 in a smaller number of bus cycles. In the example shown, active channels 206 scattered across five channel groups 204 are mapped into two 32-bit channel groups 220 and 222. With this mapping scheme, the minimum number of references from the computer is required to update the active pins. This provides a very substantial reduction in the bandwidth required for a test sequence.

Channel mapping, or "scrambling" is in effect a way of redefining the index of a tester channel. Using the example from above, channel 0 has a natural index of 0 and channel 32 has a natural index of 32. Accordingly, index 0 and index 32 have to be read or written in two separate 32-bit wide bus cycles. However, in a preferred embodiment of the invention, channel 32 can be scrambled, or remapped, to index 4, for example. Now, rather than using two separate bus cycles, a single 32-bit bus cycle can be used to read or write index 0 and index 4 together. This is possible since the address for index 0 is word 0, bit 0, while the address for index 4, to which channel 32 has been remapped, is word 0, bit 4. Thus, both channel 0 and channel 32 can be written in the same word to the device under test. Changing the index of a tester channel makes it possible to group channels into the minimum possible number of channel groups to be read from or written to the DUT. Thus, if a pin is very active, it may be desirable to map it to a bit position within a single word (or small number of words) that contains the other most active pins. The diagram in FIG. 2C is a simplified representation of mapping to a natural channel index from an alternate, optimized scrambled index. The mechanics for remapping a channel index will be described below.

Figure 2D:
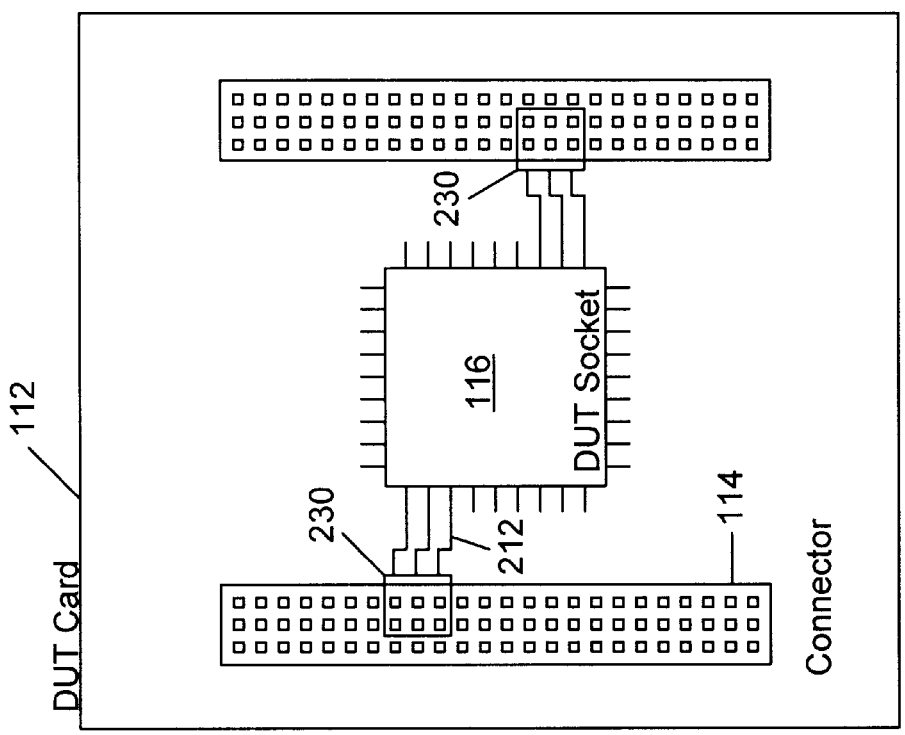
FIG. 2D shows a DUT card according to the present invention.

FIG. 2D shows the improvement over the DUT card shown in FIG. 2B as a result of the present invention. Again, a simplified version of DUT card 112 is shown with pin group 230 from connector 114 hardwired to DUT 116 by wires 212. The grouping of connector pins shown in the figure is again a simplified representation of one channel group, such as, for example, channel group 204 from FIG. 2A. However, in FIG. 2D, the grouping of pins is spread across two locations on DUT card 112, rather than concentrated at one location. This is made possible because the physical locations of these pins on DUT card 112 correspond to the single, "scrambled" channel group 220 (FIG. 2C). Again, because this group of pins on DUT 116 may be frequently accessed by a routinely performed testing operation, it is efficient for a prior art tester to group the corresponding channels into one channel group. But in FIG. 2D, the connection from bus 110 to connector pins 230 does not require that wires 212 be run from one side of DUT card 112 to the other, which can be very unwieldy, especially when the scenario is repeated for each succeeding channel group. Instead, wires 212 may be run from connector 114 to DUT 116 in the most convenient fashion possible. Because the present invention affords the flexibility of remapping channels into different channel groups within the tester memory space, the correspondence of physical DUT pin location to tester channel is now much less crucial.

Figure 3A:
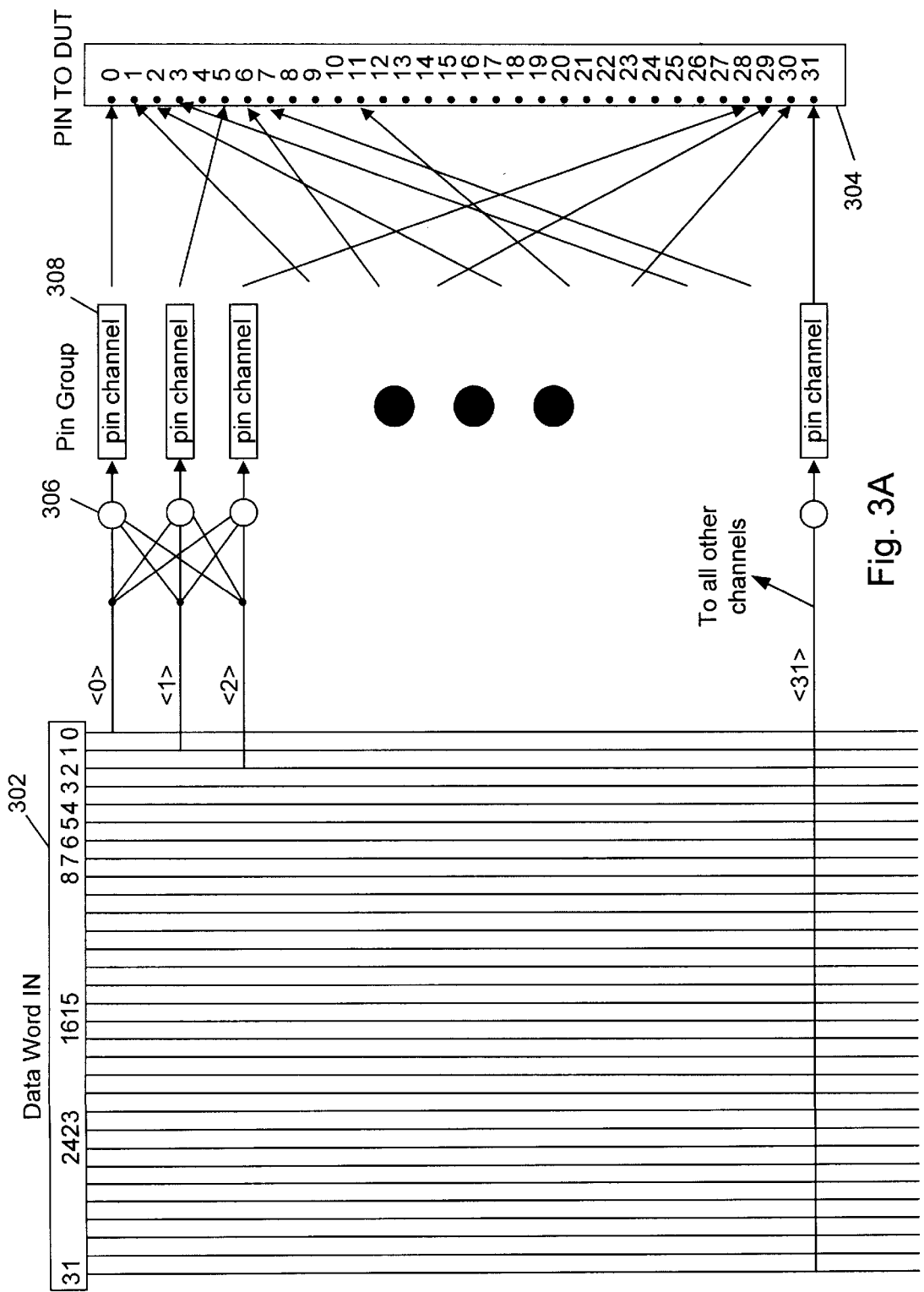
FIG. 3A shows a conceptual diagram of a general scheme for remapping channels according to the present invention.

FIG. 3A shows a conceptual diagram of a general scheme for remapping channels within a data word according to the present invention. In this implementation, each channel may be mapped from a 32-bit data input word 302 to any of the 32 locations in 32-bit channel group 304. In other words, full generality of mapping may be implemented with this scheme. Each bit <0> through <31> from data word 302 is input to a multiplexing block 306. The output of each multiplexing block 306 is transferred through additional pin channel circuitry 308 to form 32-bit channel group 304, as shown in the figure. The entire 32-bit channel group 304 may then be transferred to the DUT via a bus similar to bus 110 shown in FIG. 1. It should of course be clear that a data bus having a width of 32 bits is used here merely by way of example; in practice, any appropriate data bus width may be implemented.

Figure 3B:
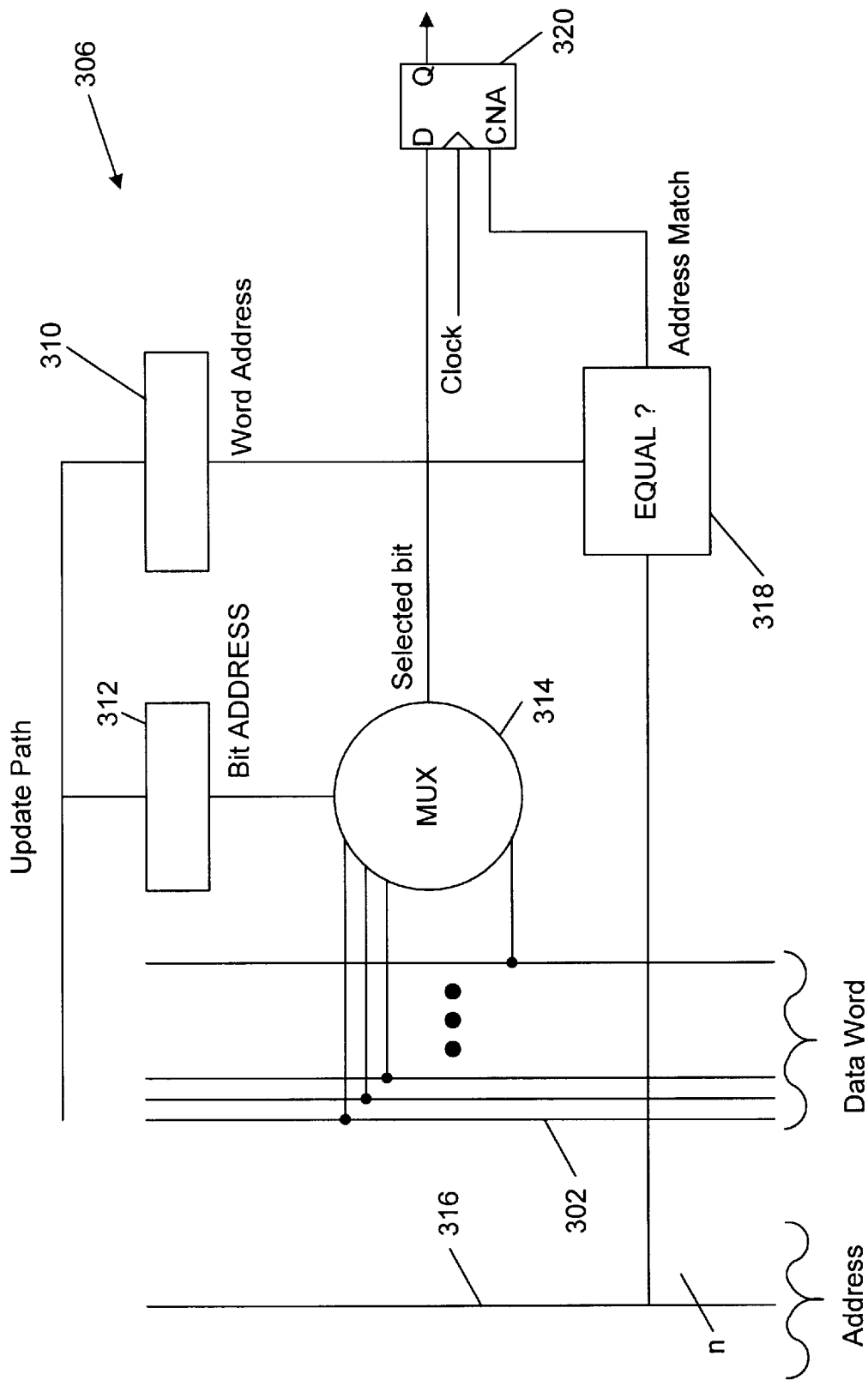
FIG. 3B shows a simplified block diagram of the multiplexing function for one bit in a channel group for a write operation.

FIG. 3B shows the remapping of data word address. In particular, FIG. 3B shows generally how an individual channel in FIG. 3A is transferred through multiplexing block 306 to respond both to any programmed word address designating a particular channel group and to any position within the addressed word for a write operation. Word address register 310 and bit address register 312 determine the "scrambled" address, which is calculated and loaded under software control, so that tester channels that are updated on a more frequent basis may be grouped together to minimize the communication bandwidth between the tester and the DUT, as discussed above. The scrambled address assignment can be updated when testing a different device, between different types of tests of the same device, or even during a single test sequence. Using the example of FIG. 2C, the updated word address register 310 could contain information as to which of the two scrambled channel groups, either 220 or 222, the channel is to be assigned. Updated bit address register 312 would locate the bit position within the addressed word. The registers are updated by the control block of the test system, such as the microprocessor. The data word lines 302 are input to a multiplexer 314. Selection of one of the data word lines is made by the contents of bit address register 312, which is the select input to multiplexer 314. Address lines 316 are input to a comparator block 318, whose other input is from word address register 310. If the address input from address lines 316 matches the contents of word address register 310, then the selected bit is transferred through flip-flop 320 and placed on the channel.

In an alternate embodiment, multiplexing block 306 can utilize a lookup table in place of the combination of word address register 310 and comparator block 318. The input to the lookup table would be the tester word address on address lines 316. The output of the lookup tables would then correspond to the Address Match output of FIG. 3B. The lookup table approach is particularly effective when implementing the scrambled address approach of the present invention with programmable logic devices, which typically include memory. The lookup table approach also enables multiple matches to be specified for a given pin without additional logic. Multiple matches permit an individual pin to be mapped into more than one group of active pins, which can reduce the need for reloading the scramble information for different phases of a test program. The lookup table may be implemented by any of a known variety of methods, such as, for example, a random access memory (RAM).

Figure 3C:
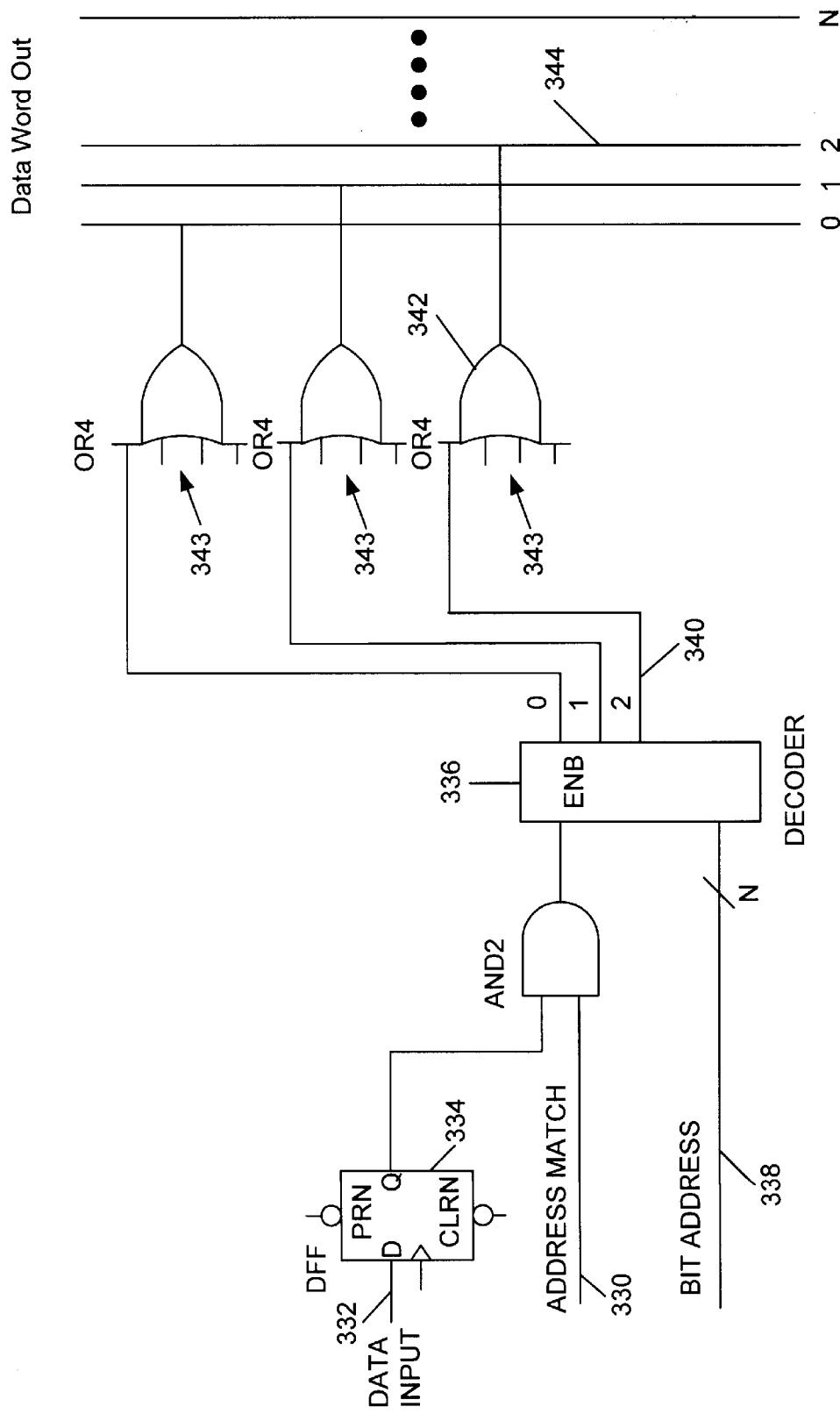
FIG. 3C shows a simplified block diagram of the multiplexing function for one bit in a channel group for a read operation.

FIG. 3C shows generally how an individual channel responds both to any programmed word address designating a particular channel group and to any position within the addressed word for a read operation. In general, read operations initiated by a tester occur less frequently than write operations, so they have a smaller impact on test data throughput. It is of considerable convenience for test program development and operation to be able to read information from the tester using the same scrambled address mechanism that was used for writing the test data to the device under test.

As with the scramble write operation described in conjunction with FIG. 3B, there must be both a word address matching scheme and a mechanism to reposition each bit within the word, if full generality of mapping is desired. The word address matching is done similar to FIG. 3C, using either the combined word address register and comparator block or, alternatively, a lookup table. In FIG. 3C, the Address Match signal 330 is combined with the data input 332 from the device pin that is input to register 334 to enable a binary-to-unary decoder 336. The bit address signal 338 (see FIG. 3B) is passed through decoder 336 and is converted from a binary value to a unary value. For example, if bit address 338 has a binary value of two (2), the third decoder output 340 (labeled ("2") is activated. The decoder output is fed through OR gate 342 to ultimately drive the BIT 2 data line 344, which is input to the control unit of the tester. OR gate inputs 343 are provided by the decoding circuitry for other bit positions. OR gates 342 provide for other bits within the same data word to be fed to the same data lines. This mechanism allows each bit to be mapped to any position within a word and, in conjunction with the address match mechanism, to any word address.

As noted above, the embodiment of the present invention shown in FIG. 3 provides for full generality of mapping for both read and write operations. Each channel may be mapped from any position in a 32-bit data input word to any of the 32 locations in any of the tester's 32-bit channel groups. However, this would require multiplexer 314 in FIG. 3B to be a 32-to-1 multiplexer for each bit position, which significantly increases circuit overhead and complexity. These costs can be reduced by recognizing that full generality of mapping is not required in all cases. Tester channels may be divided into subgroups so that they can only be mapped to a subset of the 32 bit positions, if the system word width is 32 bits. Thus, an alternative embodiment would require a smaller multiplexer for each subgroup of bits. For example, if there are four subgroups of tester channel, the 32-to-1 multiplexer of FIG. 3B can be replaced with a simpler 8-to-1 multiplexer, which keeps circuit overhead to a minimum while significantly improving flexibility of testing. This embodiment is discussed below.

Figure 4A:
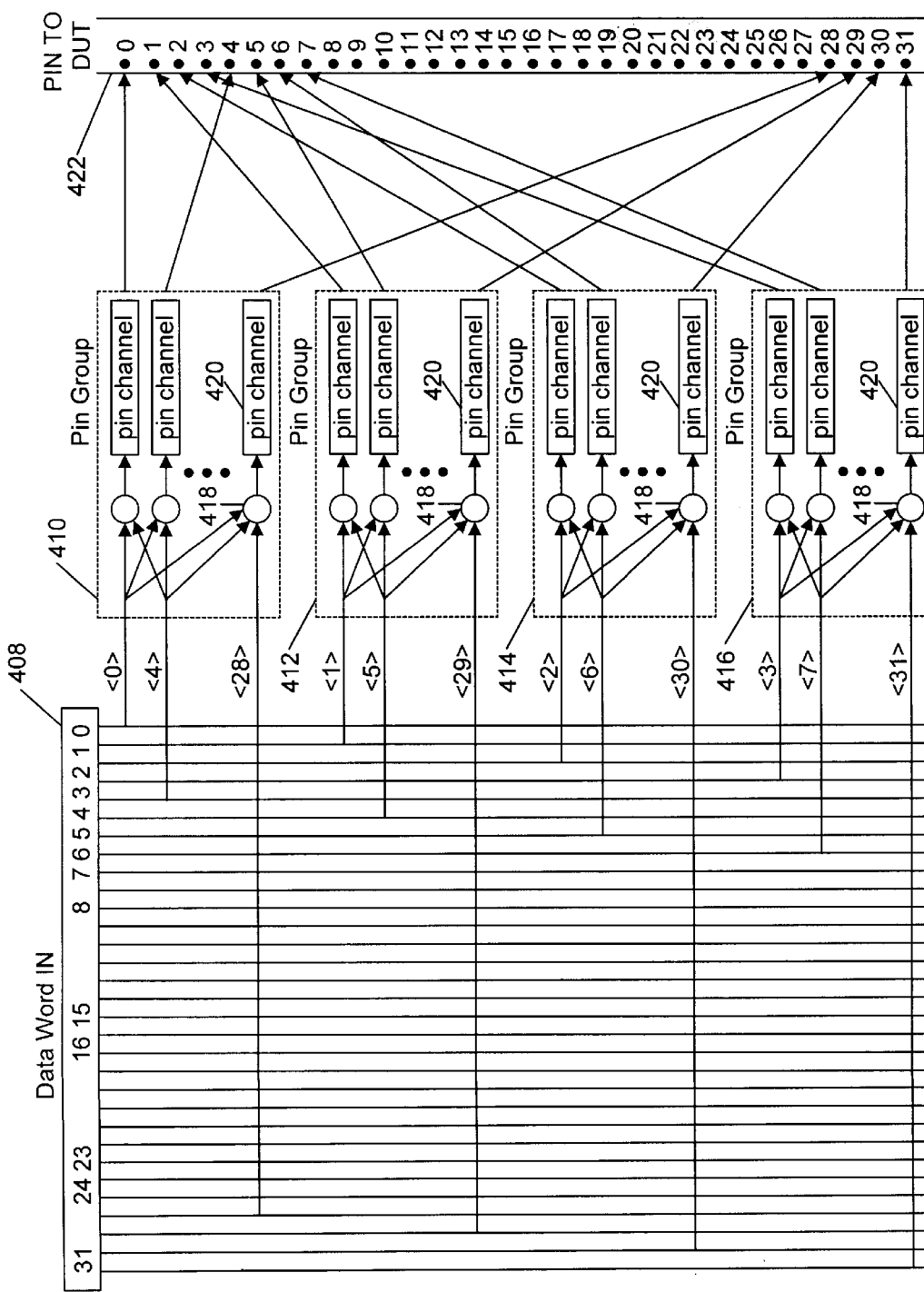
FIG. 4A shows a preferred embodiment for the remapping of the channels for one 32-bit ride channel group.

FIG. 4A shows a preferred embodiment for the remapping of the channels for one 32-bit wide channel group. In this implementation, four subblocks of eight channels each may be mapped from the 32-bit data input word 408. Each subblock is designated either 0, 1, 2, or 3 as determined by the application of the modulus operator ("MOD"). The result of the modulus operator is the remainder, and not the quotient, from integer division. In this embodiment, each bit of the 32-bit wide channel group is remapped, or indexed, accordingly: <bit number> MOD 4. Thus, bits remapped to subblock "0" are the bits that have "0" as the remainder when divided by 4. For example, but <8>MOD4 is the result of 8 divided by 4, or 8/4 , which has no remainder and is remapped into subblock 0. However, bit <9> MOD 4 is the result of 9 divided by 4, or 9/4, which yields a remainder of 1, and thus is remapped into subblock 1. The first subblock 410 of eight channels is formed by bits <0>, <4>, <8>, <12>, <16>, <20>, <24> and <28>, or those bits in the 32-bit data input word 408 where bit position MOD 4 =0. The second subblock 412 of eight channels is formed by bits <1>, <5>, <9>, <13>, <17>, <21>, <25> and <29>, or those bits in the 32-bit data input word 408 where the bit position MOD 4=1. The third subblock 414 of eight channels is formed by bits <2>, <6>, <10>, <14>, <18>, <22>, <26> and <30>, or those bits in the 32-bit data input word 408 where the bit position MOD 4=2. Finally, the fourth subblock 416 of eight channels is formed by bits <3>, <7>, <11>, <15>, <19>, <23>, <27> and <31>, or those bits in the 32-bit data input word 408 where the bit position MOD 4=3. Within each subblock, all eight bits are input to a multiplexing block 418 that performs an 8-to-1 multiplexing function. There are 32 multiplexing blocks 418 in all, one for each bit. The output of each multiplexing block 418 is transferred through additional pin channel circuitry 420 to form a 32-bit word 422. The entire 32-bit channel group 422 may then be transferred to the DUT via a bus similar to bus 110 shown in FIG. 1.

As shown in FIG. 4A, the first bit in subblock 410 corresponds to bit position <0> of channel group 422, the second bit in subblock 410 corresponds to bit <4> of channel group 422, and so on. Similarly, the first bit in subblock 412 corresponds to bit position <1> of channel group 422, the second bit in subblock 412 corresponds to bit <5> of channel group 422, and so on. The same configuration holds true for subblocks 414 and 416. Thus, the "natural" channel for bit position <0> of channel group 422 is bit <0> of data input word 408. However, as indicated in the figure, any of the bits in subblock 410 may be mapped into bit position <0> of channel group 422 through 8-to-1 multiplexer 418. This flexibility allows any one of the bits in a subblock to be mapped into any of the eight bit positions in channel group 422. Thus, for example, a channel group could include channels 0 and 4 for one test, but could also include channels 0 and 36 in one channel group for another test. In either case, the channels could fit into minimum number of physical groups that can be written to or read from the DUT in the fewest number of bus cycles, rather than expending additional bus cycles to complete the transaction by writing the extra channel groups to the DUT.

Figure 4B:
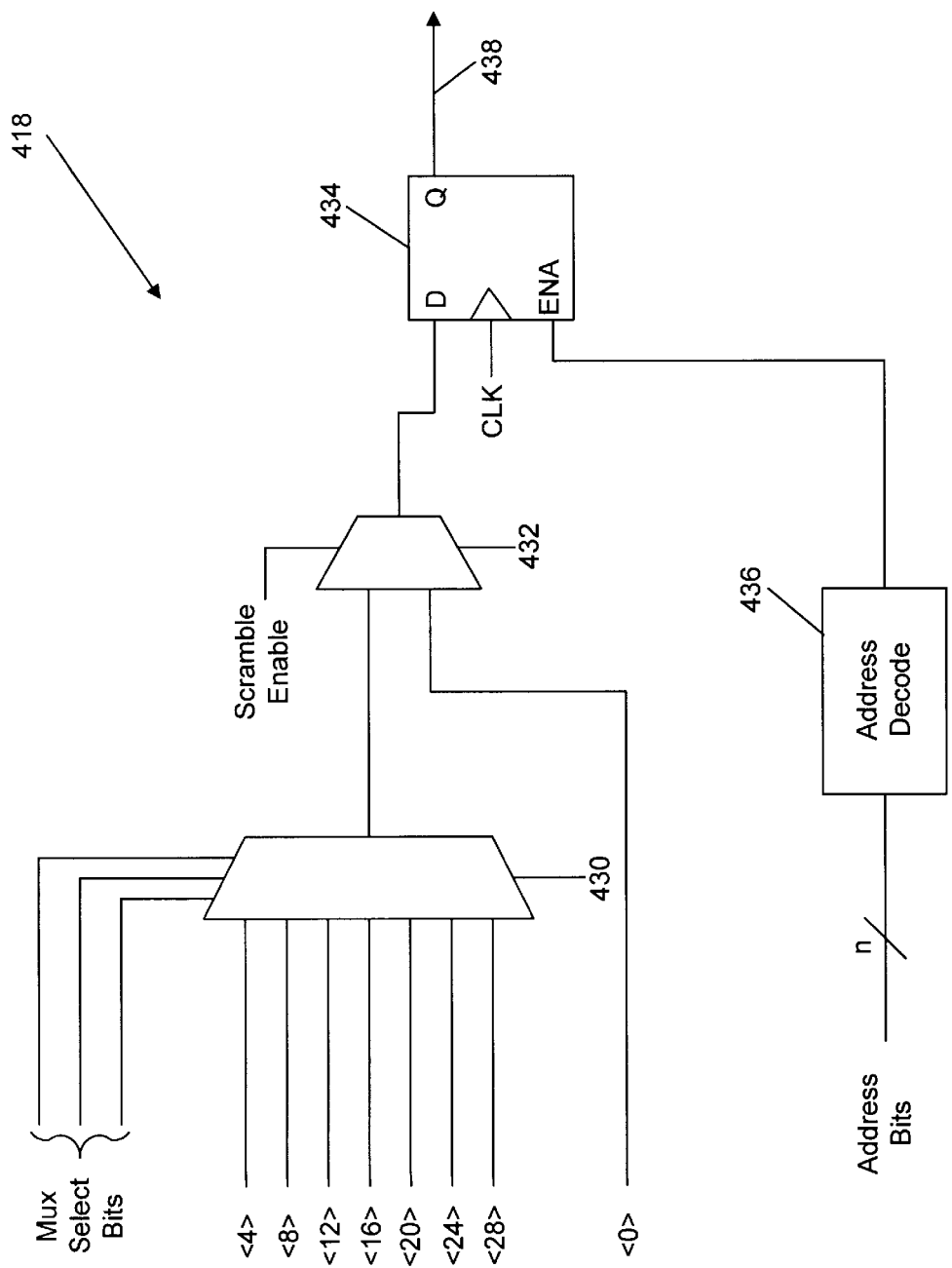
FIG. 4B shows a simplified block diagram of the multiplexing function for one bit in a channel group subblock.

FIG. 4B shows a simplified block diagram of one possible implementation of the multiplexing function 418 for one bit in one of the channel group subblocks 410–416 shown in FIG. 4A. FIG. 4B shows an example of how an individual channel may be designed to respond to any programmed word address and position within the word. In the preferred implementation, a channel has both a fixed natural address and the dynamically assigned scramble address. As described above, the scrambled address fields are determined and loaded under software control so that frequently changed pins are grouped together to minimize update bandwidth. Again, this scramble address assignment can be easily updated when testing a different device, between different types of tests of the same device, or even during a single test sequence.

In the example of FIG. 4B, the "natural" channel shown is bit position <0> in the 32-bit data input word 408. This bit, as well as the remaining seven data bits in subblock 410, are input to multiplexer 430, which is controlled by three multiplexer select bits under programmable control. The output of multiplexer 430 is input to multiplexer 432 along with the natural channel <0>. Mux 432 is controlled by a Scramble Enable bit, which may also be programmably controlled by the tester or included in the address word generated by the control unit. If the Scramble Enable bit is set, then the scrambled channel, that is one of channels <0> through <28>, is selected. Otherwise, if the Scramble Enable bit is not set, the natural channel <0> is selected. The output of multiplexer 432 is the data input to flip-flop 434, which is clocked by a CLK signal. Flip-flop 434 is enabled by the output of Address Decoder block 436, which receives n address bits and decodes the enable signal for the appropriate multiplexing block 418. The output line 438 from flip-flop 434 is sent through pin channel circuitry 420.

It should be noted that in some cases, rather than just having a natural address and only one single scramble address, it may be valuable for a single channel to have more than one scramble address. That is, a pin may belong to more than one scramble channel group.

Figure 5:
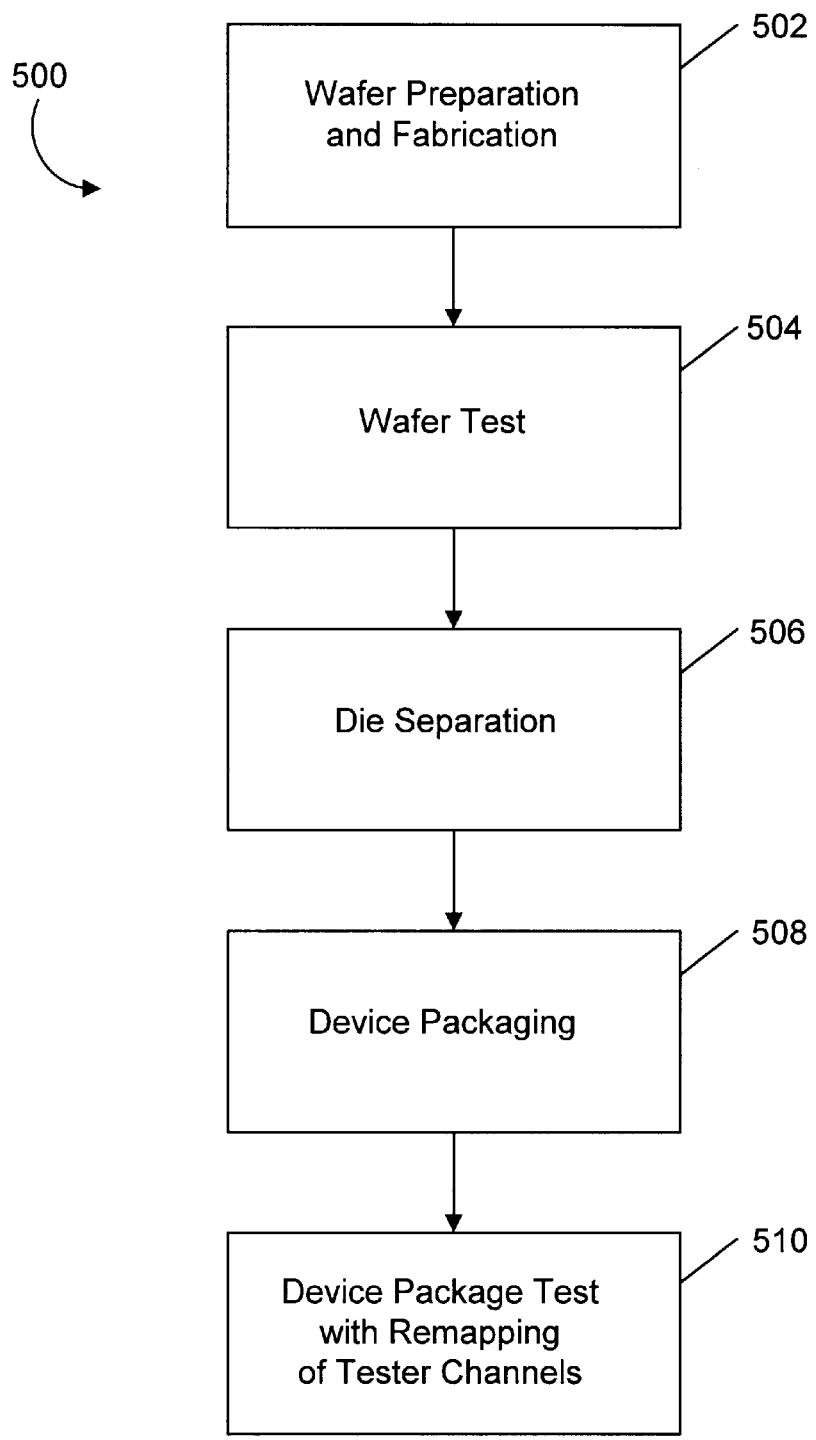
FIG. 5 is a flow diagram of the manufacturing process for an integrated circuit chip according to the present invention.

As noted above, integrated circuit chips customarily undergo exhaustive testing during the manufacture process prior to encapsulation in a package or use of the package on a circuit board in order to ensure reliable operation of the chip. The method and apparatus described above for increasing the vector rate of an integrated circuit test system is integrated into the chip manufacturing process 500, as shown in FIG. 5. Generally, the first step 502 involves the preparation of a semiconductor wafer through crystal growth and the fabrication of individual electrical circuits on the wafer through ion implantation. After the individual electrical circuits are fabricated on a semiconductor wafer, the wafer is tested in step 504 to identify the circuits that are within specified limits and those that are not. Within the testing step 504 is included the step of remapping assignments of tester channels in the tester memory space, which increases the vector rate of the integrated circuit test system and simplifies coupling the tester to the device under test. Once the good circuits have been identified, the wafer is separated into individual chip dice in step 506 so that only the good circuits are used further in the manufacture process. In step 508, each individual chip die is assembled into an appropriate device package suitable for incorporation into an end-use circuit. The device package itself is then tested in step 510 by the integrated circuit test system of the present invention to provide a final test of reliability and functionality. Again, within testing step 510 is included the step of remapping assignments of tester channels in the tester memory space, which increases the vector rate of the integrated circuit test system and simplifies coupling the tester to the device under test. The devices that pass the final manufacturing step are reliable, functioning semiconductor devices.

Figure 6:
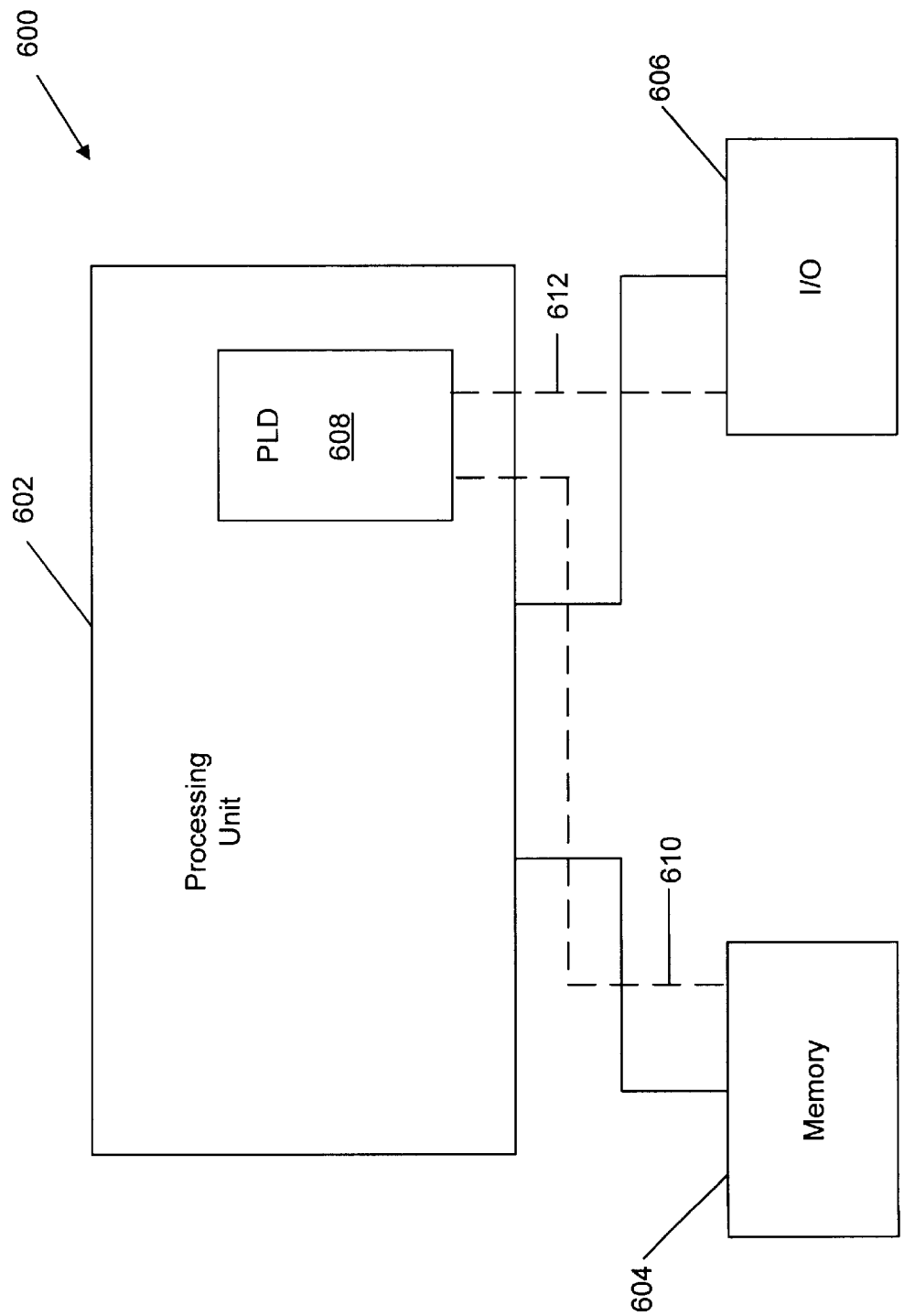
FIG. 6 shows a block diagram of a digital system in which a device tested by the present invention may be embodied.

The purpose of carrying out tests on a semiconductor device is, of course, to verify that the manufacturing process yields an operable semiconductor device suitable for end-use circuit and system level designs. As an example, FIG. 6 shows a block diagram of a digital system 600 within which a device tested by the present invention may be embodied. In the particular embodiment of FIG. 6, a processing unit 602 is coupled to a memory 604 and an I/O 606 and incorporates a programmable logic device (PLD) 608. PLD 608 is manufactured with the method and apparatus disclosed above. PLD 608 may be specially coupled to memory 604 through connection 610 and to I/O 606 through connection 612. The system may be a programmed digital computer system, digital signal processing system, specialized digital switching network, or other processing system. Moreover, the system may be a general purpose computer, a special purpose computer (such as telecommunications equipment) optimized for an application-specific task such as programming PLD 608, or a combination of a general purpose computer and auxiliary special purpose hardware.

Processing unit 602 may direct data to an appropriate system component for processing or storage, execute a program stored in memory 604 or input using I/O 606, or other similar function. Processing unit 602 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 608 may control the logical operations of the system.

In some embodiments, processing unit 602 may even be a computer system. In one embodiment, source code may be stored in memory 604, compiled into machine language, and executed by processing unit 602. Processing unit 602 need not contain a CPU and in one embodiment, instructions may be executed by one or more PLDs 608. Instead of storing source code in memory 604, only the machine language representation of the source code, without the source code, may be stored in memory 604 for execution by processing unit 602. Memory 604 may be a random access memory (RAM), read only memory (ROM), fixed or flexible disk media, PC Card flash disk memory, tape, or any other storage retrieval means, or any combination of these storage retrieval means.

Processing unit 602 uses I/O 606 to provide an input and output path for user interaction. For example, a user may input logical functions to be programmed into programmable logic device 608. I/O 606 may be a keyboard, mouse, track ball, digitizing tablet, text or graphical display, touch screen, pen tablet, printer, or other input or output means, or any combination of these means. In one embodiment, I/O 606 includes a printer used for printing a hard copy of any processing unit 602 output. In particular, using I/O 606, a user may print a copy of a document prepared using a word processing program executed using processing unit 602. In other cases, a user may print out a copy of the source code or a listing of the logical functions contained within PLD 608.

PLD may serve many different purposes within the system in FIG. 6. PLD 608 may be a logical building block of processing unit 602, supporting its internal and external operations. PLD 608 is programmed to implement the logical functions necessary to carry on its particular role in system operation.

As some examples of the multitude of uses for PLD 608, processing unit 602 may use PLD 608, through connection 610, to decode memory or port addresses for accessing memory 604 or I/O 606. PLD 608 may be programmed to store data like a memory or specialized memory, where this comes from processing unit 602 or memory 604 (via connection 610). PLD 608 may be used as a microcontroller for a memory 604 device such as a fixed or flexible disk drive. PLD 608 may also be configured to be a microcontroller for an I/O 606 device such as a keyboard or scanner, passing data through connection 612.

In other embodiments, PLD 608 may be used as a controller or specialized processing unit such as a coprocessor for performing mathematical or graphical calculations. In still other embodiments, PLD 608 may be used for telecommunications applications. For example, processing unit 602 would direct data to PLD 608; PLD 608 processes this data; then PLD 608 returns the results to processing unit 602. Furthermore, processing unit 602 may pass or direct a program stored in memory 604 or input using I/O 606 to PLD 608 for execution. These are some of multitude of uses of PLD 608 within a digital system. Also, a system such as the one shown in FIG. 6 may embody a plurality of PLDs 608, each performing different system functions.

The system shown in FIG. 6 may also be used for programming PLD 608 with a particular logic pattern. A computer program for designing functions into a PLD may be stored in memory 604 and executed using processing unit 602. Then, a design characteristic which is to be programmed into PLD 608 is input via I/O 606 and processed by processing unit 602. In the end, processing unit 602 transfers and programs the design characteristic into PLD 608.

In FIG. 6, processing unit 602 is shown incorporating PLD 608. However, in other embodiments, PLD 608 may be external to processing unit 602, and a PLD interface may be coupled between processing unit 602 and PLD 608. The PLD interface would provide the proper adapters or sockets for interfacing PLD 608 to processing unit 602. Moreover, the PLD interface would provide the proper voltages and electrical characteristics for coupling PLD 608 to processing unit 602.

The above description is illustrative and not restrictive. Many variations of the invention will become apparent to those of skill in the art upon review of this disclosure. The scope of the invention should, therefore, be determined not with reference to the above description, but instead should be determined with reference to the appended claims along with their full scope of equivalents.

What is claimed is:

1. A device tester comprising:
    a plurality of pin connections for coupling test channels to a device in a one-to-one correspondence;
    two or more blocks for receiving digital data words and applying bits in the digital data words to the test channels in a first mapping arrangement;
    a processor for transferring digital data words to the two or more blocks, wherein a data word is transferred to less than all of the blocks during a single processor transaction;
    a remapping circuit for changing the application of bits to test channels in the blocks to a second mapping arrangement, wherein said remapping circuit further comprises circuitry for remapping a selected number of bits into a minimum number of blocks, and wherein said remapping circuit further comprises a multiplexer.

2. The device tester of claim 1 wherein said remapping circuit further comprises a lookup table.

3. The device tester of claim 1, wherein the remapping circuit performs a remapping of at least two bits from other blocks to a given block.

4. A method for testing a device under test, the method using a processor coupled to multiple block devices, the block devices adapted for receiving digital data from the processor, mapping the digital data to testing channels and outputting signals over the testing channels in response to the digital data for testing pins on the device under test, wherein less than the total number of block devices can be loaded with digital data by the processor in a single processor transaction, the method comprising
    using the processor to output a first set of data to the blocks for purposes of applying a first test vector to the device under test;
    remapping the assignment of digital data to testing channels within at least one of the blocks, wherein the step of remapping further comprises remapping a selected number of testing channels into a predetermined block, and wherein the step of remapping uses a multiplexer; and
    using the processor to output a second set of data to at least one block for purposes of applying a second test vector to the device under test, wherein, had the remapping step not been performed, additional processor transactions would have to be preformed to apply the second test vector.

5. The method of claim 4, further comprising repeating the remapping to apply additional test vectors.

6. The method of claim 4, wherein the step of remapping uses a lookup table.

* * * * *

UNITED STATES PATENT AND TRADEMARK OFFICE
CERTIFICATE OF CORRECTION

PATENT NO. : 6,076,179
DATED : June 13, 2000
INVENTOR(S) : Hendricks, et. al.

It is certified that error appears in the above-identified patent and that said Letters Patent is hereby corrected as shown below:

In the claims, column 12 at line 27 of claim 4: "preformed" should read --performed--.

Signed and Sealed this

Twenty-second Day of May, 2001

*Attest:*

NICHOLAS P. GODICI

*Attesting Officer*   Acting Director of the United States Patent and Trademark Office